United States Patent
Naito et al.

(10) Patent No.: US 9,344,056 B2
(45) Date of Patent: May 17, 2016

(54) RESONATOR, OSCILLATOR, ELECTRONIC APPARATUS, AND MOVING OBJECT

(71) Applicant: Seiko Epson Corporation, Tokyo (JP)

(72) Inventors: Matsutaro Naito, Minowa (JP);
Manabu Kondo, Matsumoto (JP);
Kensaku Isohata, Minowa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/532,444

(22) Filed: Nov. 4, 2014

(65) Prior Publication Data
US 2015/0123742 A1 May 7, 2015

(30) Foreign Application Priority Data
Nov. 5, 2013 (JP) ................................. 2013-229054

(51) Int. Cl.
| | |
|---|---|
| *H03B 5/32* | (2006.01) |
| *H01L 41/047* | (2006.01) |
| *H01L 41/053* | (2006.01) |
| *H03H 9/10* | (2006.01) |
| *H03H 9/13* | (2006.01) |
| *H03H 9/19* | (2006.01) |

(Continued)

(52) U.S. Cl.
CPC ............... *H03H 9/17* (2013.01); *H01L 41/047* (2013.01); *H01L 41/053* (2013.01); *H01L 41/092* (2013.01); *H03B 5/32* (2013.01); *H03H 9/02023* (2013.01); *H03H 9/02102* (2013.01); *H03H 9/0504* (2013.01); *H03H 9/0514* (2013.01); *H03H 9/0538* (2013.01); *H03H 9/0547* (2013.01); *H03H 9/10* (2013.01); *H03H 9/1014* (2013.01); *H03H 9/132* (2013.01); *H03H 9/19* (2013.01)

(58) Field of Classification Search
CPC . H01L 41/047; H01L 41/053; H01L 41/0533; H01L 41/092; H03B 5/30; H03B 5/32; H03H 9/05; H03H 9/0538; H03H 9/08; H03H 9/10; H03H 9/132; H03H 9/15; H03H 9/17; H03H 9/19
USPC .......... 310/343, 348, 365, 367–369; 331/154, 331/156, 158
See application file for complete search history.

(56) References Cited

U.S. PATENT DOCUMENTS 2,799,789 A * 7/1957 Wolfskill ........................ 310/312
4,091,303 A * 5/1978 Tadataka et al. ............... 310/343

(Continued)

FOREIGN PATENT DOCUMENTS

| JP | 06-081135 U | 11/1994 |
|---|---|---|
| JP | 07-176971 A | 7/1995 |

(Continued)

*Primary Examiner* — Levi Gannon
(74) *Attorney, Agent, or Firm* — Harness, Dickey & Pierce, P.L.C.

(57) ABSTRACT

A resonator includes: a package; a support section that is provided on a surface of the package; and a vibration element in which an attachment section, which is disposed between an outer edge of a vibration substrate, in which excitation electrodes are provided on main surfaces thereof, and an outer edge of the excitation electrode, is attached to the support section through a conductive adhesive. The attachment section is disposed in a region S obtained by rotating a virtual line which connects the center of the vibration element and one end of the vibration element, in a range of −35° to +35° of a rotation angle θ about the center, and an attachment area becomes 0.7 mm² or more.

20 Claims, 11 Drawing Sheets

(51) Int. Cl.
*H03H 9/17* (2006.01)
*H01L 41/09* (2006.01)
*H03H 9/05* (2006.01)
*H03H 9/02* (2006.01)

(56) References Cited

U.S. PATENT DOCUMENTS

| | | | | |
|---|---|---|---|---|
| 4,374,377 A | * | 2/1983 | Saito et al. | 340/384.6 |
| 4,431,937 A | * | 2/1984 | White | 310/344 |
| 4,625,138 A | * | 11/1986 | Ballato | 310/320 |
| 4,748,367 A | * | 5/1988 | Bloch et al. | 310/343 |
| 6,016,025 A | * | 1/2000 | Wold et al. | 310/369 |
| 6,707,234 B1 | * | 3/2004 | Kawashima | 310/367 |
| 7,157,983 B2 | * | 1/2007 | Tanaka | 331/158 |
| 2003/0048044 A1 | * | 3/2003 | Iwasaki et al. | 310/348 |
| 2003/0218512 A1 | * | 11/2003 | Zhang et al. | 331/158 |
| 2004/0135471 A1 | | 7/2004 | Arai et al. | |
| 2009/0302716 A1 | * | 12/2009 | Ohara et al. | 310/363 |
| 2012/0212107 A1 | * | 8/2012 | Yamaguchi et al. | 310/353 |

FOREIGN PATENT DOCUMENTS

| | | |
|---|---|---|
| JP | 11-298288 A | 10/1999 |
| JP | 11-308067 A | 11/1999 |
| JP | 2004-080711 A | 3/2004 |
| JP | 2008-131167 A | 6/2008 |
| JP | 2009-158999 A | 7/2009 |
| JP | 2010-147625 A | 7/2010 |
| JP | 2013-141313 A | 7/2013 |

* cited by examiner

RESONATOR, OSCILLATOR, ELECTRONIC APPARATUS, AND MOVING OBJECT

BACKGROUND

1. Technical Field

The present invention relates to a resonator, an oscillator, an electronic apparatus, and a moving object that use the resonator.

2. Related Art

In the related art, a resonator is known, in which a vibration element is attached to a package using a conductive adhesive as a joining material. For example, in a piezoelectric device (resonator) disclosed in JP-A-2008-131167, a support spacer (support section) is included inside a bore provided on a base of a package in which the vibration element is air-tightly sealed, and the vibration element is mounted on the support spacer. The vibration element is attached to the package using the support spacer as a support by the conductive adhesive disposed inside the bore.

It is required for a resonator to have a high attachment strength of a vibration element, in order to secure so-called impact resistance against an impact imposed from external factors, such as falling. In order to increase the attachment strength, it is effective to increase an attachment area. In the piezoelectric device (resonator) disclosed in JP-A-2008-131167, the vibration element uses the support spacer (support section) as a support, and thus, in order to increase an attachment area, it is necessary to dispose a great amount of conductive adhesive inside the bore. However, when the great amount of conductive adhesive is disposed inside the bore, there is a concern that the conductive adhesive spills out toward an excitation section of the vibration element, it is difficult to control the spilling-out position, stress generated in the vibration element is changed due to variation of the spilling-out position of the conductive adhesive, and thus aging characteristics of a frequency or a crystal impedance (CI) value may deteriorate. In addition, when the great amount of conductive adhesive is disposed inside the bore, there is a concern that bubbles referred to as voids are likely to be produced in the conductive adhesive, the conductive adhesive is solidified with the voids included, and then, the voids cause the attachment strength of the vibration element to be decreased.

SUMMARY

An advantage of some aspects of the invention is to solve at least a part of the problems described above, and the invention can be implemented as the following forms or application examples.

Application Example 1

This application example is directed to a resonator including: abase substrate; a support section that is provided on a surface of the base substrate; and a vibration element in which an attachment section, which is disposed, in a plan view, between an outer edge of a vibration substrate, in which excitation electrodes are provided on main surfaces thereof, and an outer edge of the excitation electrode, is attached to the support section through a joining material. The attachment section is disposed in a region obtained by rotating a virtual line which connects the center of the vibration element and one end of the vibration element, in a range of −35° to +35° of a rotation angle θ about the center, and an attachment area becomes 0.7 mm² or more.

According to this application example, the attachment section of the vibration element is disposed in the region obtained by rotating the virtual line which connects the center of the vibration element and one end of the vibration element, in a range of −35° to +35° of a rotation angle θ about the center, and an attachment area becomes 0.7 mm² or more, such that it is possible to increase an attachment strength of the vibration element using the joining material. In addition, a dispositional variation of the joining material can be small, and thus it is possible to decrease degradation of aging characteristics of a frequency or a crystal impedance (CI) value, or to decrease a frequency change in a temperature change (frequency-temperature characteristic).

Application Example 2

In the resonator according to the application example described above, it is preferable that the rotation angle θ is in a range of −30° to +30°.

According to this application example, since the dispositional variation of the joining material is less than that according the Application Example 1, it is possible to decrease characteristic degradation due to an effect of the joining material. Accordingly, it is possible to realize a highly stable aging characteristic with the further decreased characteristic degradation, and to decrease a range of the frequency change in the temperature change (frequency-temperature characteristic).

Application Example 3

In the resonator according to the application example described above, it is preferable that the vibration substrate is an SC cut quartz crystal substrate that has an orthogonal coordinate system (X', Y'', Z') which is obtained by rotating an orthogonal coordinate system (X, Y, Z) about an X axis by a predetermined angle, and rotating a new orthogonal coordinate system (X, Y', Z') obtained by the previous rotation about a Z' axis by a predetermined angle, and that a crossing angle φ formed by the X' axis and the virtual line is in a range of −45° to +90°.

According to this application example, it is possible to further decrease the characteristic degradation due to the effect of the joining material, in a correlation between the crossing angles φ formed by a crystal axis (X' axis) of a quartz crystal and the virtual line. Accordingly, it is possible to provide a resonator which has a stable aging characteristic with further decreased characteristic degradation.

Application Example 4

In the resonator according to the application example described above, it is preferable that the crossing angle φ is in a range of −30° to +30°.

According to this application example, it is possible to further decrease characteristic degradation due to the effect of the joining material, in a correlation between the crossing angles φ formed by a crystal axis (X' axis) of a quartz crystal and the virtual line. Accordingly, it is possible to provide a resonator which has a stable aging characteristic with further decreased characteristic degradation.

Application Example 5

In the resonator according to the application example described above, it is preferable that a plurality of the attachment sections are provided.

According to this application example, a plurality of attachment sections is arranged, and thus it is possible to further improve the attachment strength of the vibration element.

Application Example 6

In the resonator according to the application example described above, it is preferable that a plurality of convex sections are provided on a front surface of the support section.

According to this application example, one end of the vibration element is attached to the support section, in which the plurality of convex sections is included on a front surface thereof using the joining material. Since the plurality of convex sections is provided on the front surface of the support section, the surface area is increased and it is possible to increase the attachment strength. In addition, since the joining material is disposed in small spaces between convex sections due to capillarity, voids are unlikely to be produced, and it is possible to suppress the decrease of the attachment strength due to the voids. Accordingly, it is possible to provide a resonator in which it is possible to decrease the degradation of the aging characteristic by decreasing the dispositional variation of the joining material, and increase the attachment strength of the vibration element.

Application Example 7

In the resonator according to the application example described above, it is preferable that the support section includes: a support main body section that is provided on the base substrate; and the plurality of convex sections that protrudes from the top surface of the support main body section.

According to this application example, since the convex sections are provided to protrude from the top surface of the support main body section, it is possible to form the convex sections and the support main body section integrally, and to arrange the support section in a simple method.

Application Example 8

In the resonator according to the application example described above, it is preferable that the support section is configured to have the plurality of convex sections that is provided separately from the base substrate.

According to this application example, for example, it is possible to use stud bumps or the like, and thus it is possible to arrange the support section in a simple method.

Application Example 9

In the resonator according to the application example described above, it is preferable that the convex section is a metal bump.

According to this application example, the support section is configured of the metal bump, and thus it is possible to arrange the support section having a high thermal conductivity in a simple method.

Application Example 10

In the resonator according to the application example described above, it is preferable that a base is provided on a surface of the base substrate facing the end of the vibration element in a region except for a portion where the attachment section is disposed.

According to this application example, since the base is provided on the surface of the base substrate facing the end of the vibration element in a region except for one end of the vibration element, and the vibration element is supported by the base, it is possible to cause a connection posture of the vibration element to be stable. In addition, even during the attachment of the vibration element, it is possible to position the vibration element in a simple method.

Application Example 11

In the resonator according to the application example described above, it is preferable that a plurality of the bases are provided.

According to this application example, since the plurality of bases is provided, it is possible to cause the connection posture of the vibration element to be more stable.

Application Example 12

This application example is directed to an oscillator including: the resonator according to any one of the application examples described above; a circuit element that is electrically connected to the resonator; and a package on which the resonator and the circuit element are mounted.

According to this application example, since the resonator in which the attachment strength of the vibration element is increased and the circuit element are used, it is possible to provide an oscillator with stable characteristics.

Application Example 13

This application example is directed to an electronic apparatus including: the resonator according to any one of the application examples described above.

According to this application example, since the resonator, in which the attachment strength of the vibration element is increased, is used, it is possible to provide an electronic apparatus with stable characteristics.

Application Example 14

This application example is directed to a moving object including: the resonator according any one of the application examples described above.

According to this application example, since the resonator, in which the attachment strength of the vibration element is increased, is used, it is possible to provide a moving object with stable characteristics.

BRIEF DESCRIPTION OF THE DRAWINGS

The invention will be described with reference to the accompanying drawings, wherein like numbers reference like elements.

FIG. 1A is a plan view, and FIG. 1B is a cross-sectional view taken along line A-A.

FIG. 5A is a graph illustrating a relation between a retaining angle and a frequency change range, and FIG. 5B is a schematic diagram illustrating a crossing angle φ and a rotation angle θ.

FIG. 6A is a plan view, FIG. 6B is a front cross-sectional view, FIG. 6C is a plan view of the support section in which bumps are used, and FIG. 6D is a cross-section view of FIG. 6C.

FIG. 8A is a front cross-sectional view illustrating the second embodiment, and FIG. 8B is a front cross-sectional view illustrating the third embodiment.

DESCRIPTION OF EXEMPLARY EMBODIMENTS

Hereinafter, exemplary embodiments of the invention will be described with reference to the accompanying drawings.

First Embodiment

Figure 1A:
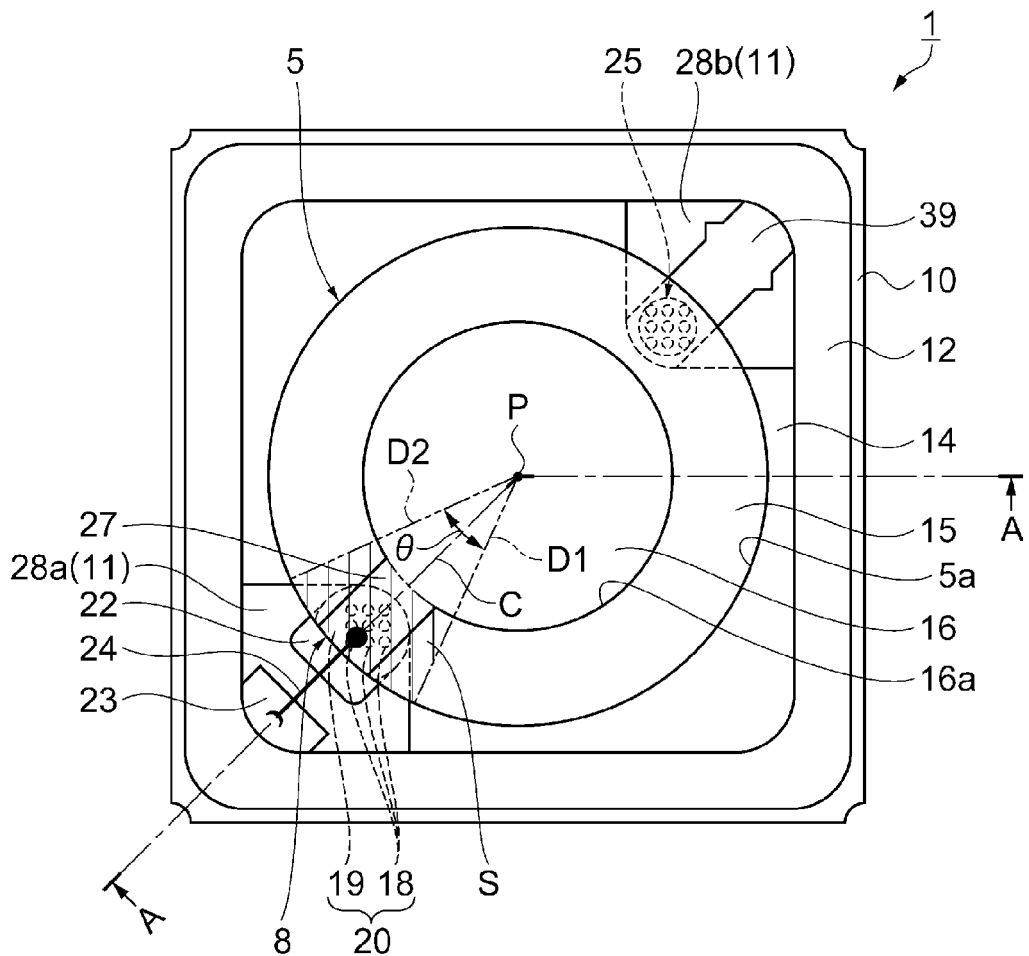
FIGS. 1A and 1B are views schematically illustrating a resonator according to a first embodiment of the invention.
Figure 1B:
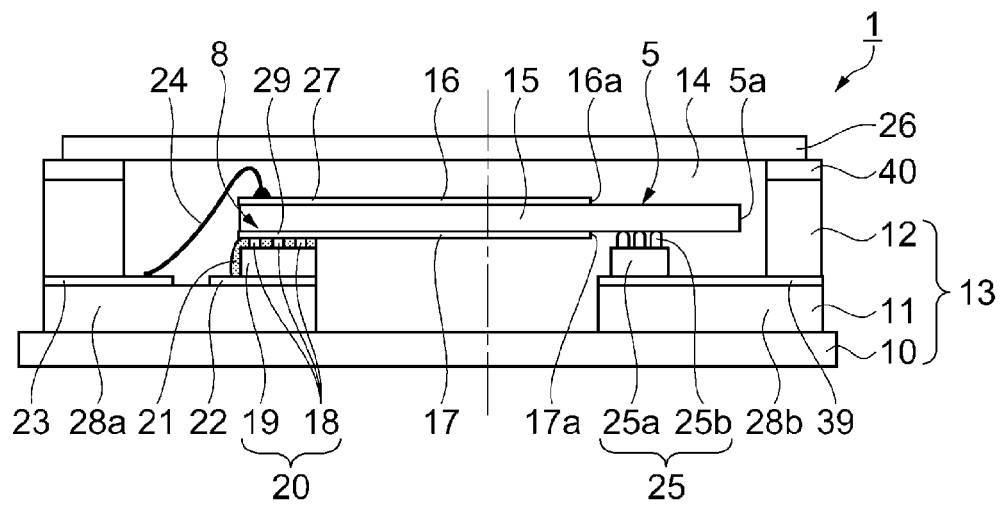

A resonator according to a first embodiment of the invention is described, with reference to FIGS. 1A and 1B. FIGS. 1A and 1B are views schematically illustrating the resonator according to the first embodiment of the invention. FIG. 1A is a plan view without a lid member (through view), and FIG. 1B is a cross-sectional view taken along line A-A.

Resonator

A resonator 1 according to the first embodiment illustrated in FIGS. 1A and 1B includes a vibration element 15 that uses a vibration substrate 5, a package 13 that accommodates the vibration element 15, a support section 20 that is provided to attach the vibration element 15 to the package 13, a base 25 that holds the vibration element 15, and a lid 26 as a cover member that forms an inner space 14 as an accommodation space between the package 13 and the lid 26. Hereinafter, the vibration element 15, the package 13, the support section 20, the base 25, and the lid 26 will be sequentially described in detail.

Vibration Element

Figure 2A:
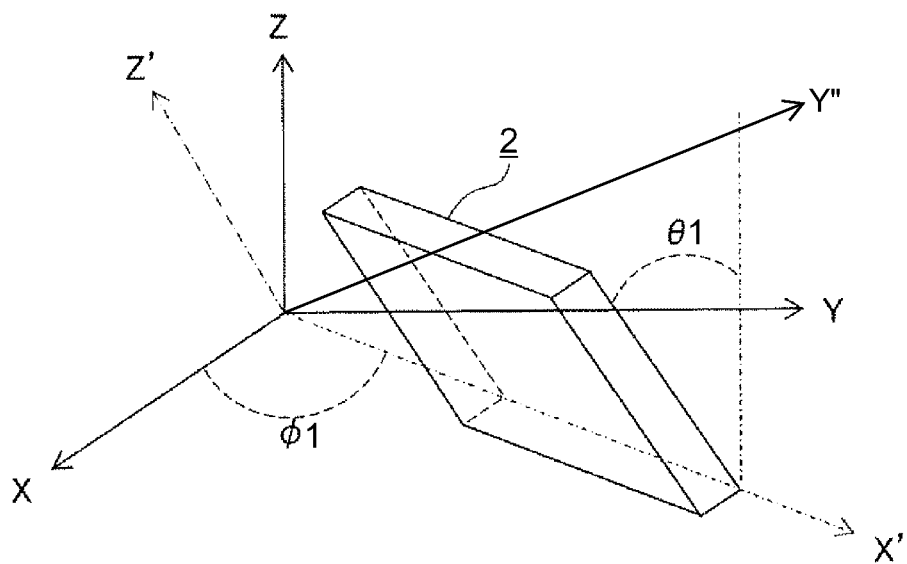
FIGS. 2A and 2B are views illustrating a method of cutting an SC cut quartz crystal substrate.
Figure 2B:
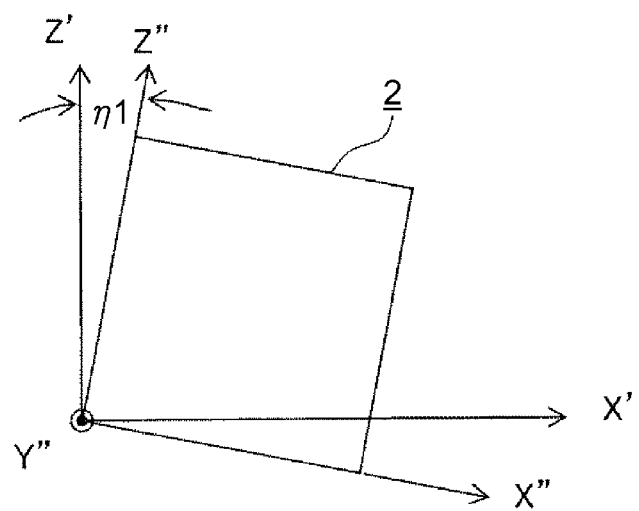

An SC cut quartz crystal substrate (piezoelectric substrate) formed by a quartz crystal, as an example of a piezoelectric material, is used as the vibration element 15 according to the embodiment. Here, the SC cut quartz crystal substrate (piezoelectric substrate) is described with reference to FIGS. 2A and 2B. FIGS. 2A and 2B are diagrams schematically illustrating a configuration of the SC cut quartz crystal substrate. Since the configuration is too complicated to be illustrated in a drawing, the drawing is divided into FIGS. 2A and 2B. An SC cut quartz crystal substrate 2 according to the present example is a quartz crystal substrate that is obtained by rotating an orthogonal coordinate system (X, Y, Z) twice as illustrated in FIG. 2A, and then rotating an orthogonal coordinate system (X', Y", Z') once as illustrated in FIG. 2B. A quartz crystal belongs to a trigonal system, and has crystal axes X, Y, and Z that are orthogonal to each other. The X, Y, and Z axes are referred to as an electrical axis, a mechanical axis, and an optical axis, respectively. The Z axis is an axis of three-fold symmetry which includes a set of the X axis and the Y axis for every 120° rotation about the Z axis, and the X axis is an axis of two-fold symmetry. The configuration of the quartz crystal is described using the orthogonal coordinate system (X, Y, Z) that includes the X axis as the electrical axis, the Y axis as the mechanical axis, and the Z axis as the optical axis, as illustrated in FIG. 2A.

As illustrated in FIG. 2A, the SC cut quartz crystal substrate 2 has the orthogonal coordinate system (X', Y", Z') which is obtained by rotating the orthogonal coordinate system (X, Y, Z) about the X axis by a predetermined angle (for example, 34°) θ1°, and rotating a new orthogonal coordinate system (X, Y', Z') obtained by the previous rotation about a Z' axis by a predetermined angle (for example, 22°) φ1°. When a rectangular substrate, of which a thickness direction is parallel to a Y" axial direction, and both main surfaces include an X'Z' surface (plane configured to include X'Z' axes), is cut, the usual SC cut quartz crystal substrate 2 is obtained.

In addition, as illustrated in FIG. 2B, when, in addition to rotating twice, the orthogonal coordinate system (X', Y", Z') is rotated about a Y" axis by η1°, a new orthogonal coordinate system (X", Y", Z") is obtained. In the new orthogonal coordinate system (X", Y", Z"), even when a rectangular substrate, of which a thickness direction is parallel to the Y" axial direction, and both main surfaces include an X"Z" surface (plane configured to include X" and Z" axes), is cut, it is possible to obtain the SC cut quartz crystal substrate 2. The SC cut quartz crystal substrate 2 according to the present example is a quartz crystal substrate in which one two-opposite-side of the rectangular SC cut quartz crystal substrate 2 is parallel to the X" axis, the other two-opposite-side thereof is parallel to the Z" axis, and the Y" axial direction becomes the thickness direction.

Flat plates cut out from these SC cut quartz crystal substrate 2 are used as the vibration substrate 5 (vibration element 15) according to the embodiment.

The quartz crystal substrate according to the invention is not limited to the above-described SC cut, but may be widely applied to other piezoelectric substrates, such as AT cut, BT cut, or the like, that vibrate in thickness-shear vibration. For example, in a case of the AT cut quartz crystal substrate, the Y axis and the Z axis are rotated about the X axis by about 35° 15', and become the Y' axis and the Z' axis, respectively. As a result, the AT cut quartz crystal substrate has crystal axes X, Y', and Z' that are orthogonal to each other. The AT cut quartz crystal substrate has the thickness direction along the Y' axis direction, a surface that includes an XZ' surface (surface including the X and Z' axes) that is orthogonal to the Y' axis as a main surface, and has the thickness-shear vibration as a main vibration. The AT cut quartz crystal substrate is machined, such that the piezoelectric substrate can be obtained as an element plate for the vibration element 15.

As illustrated in FIGS. 1A and 1B, various electrodes are formed on a first main surface and a second main surface of the vibration element 15 according to the embodiment. The first and second main surfaces have a relation of the front and the rear of the disc-shaped vibration substrate 5 formed of the SC cut quartz crystal substrate (piezoelectric substrate) 2 formed of a quartz crystal as an example of the piezoelectric material. According to the present example, excitation electrodes 16 and 17 and connection electrodes 27 and 29 are formed as electrodes. The excitation electrode 16 is substantially circular, and is formed on the central portion of the front main surface (first main surface) in the vibration substrate 5 (vibration element 15). In addition, the connection electrode 27 is formed on one end side of the front main surface (first main surface). One end of the connection electrode 27 is connected to the excitation electrode 16, and the other end thereof extends toward an outer edge 5a of the vibration substrate 5. In addition, the excitation electrode 17 is substantially circular, and is formed to substantially overlap the excitation electrode 16 on the front side, in a plan view, on the central portion of the rear main surface (second main surface) in the vibration substrate 5 (vibration element 15). The connection electrode 29 is formed to overlap the connection electrode 27 on the front main surface, in a plan view, on one end side of the rear main surface (second main surface). One end of the connection electrode 29 is connected to the excitation electrode 17, and the other end thereof extends toward the outer edge 5a of the vibration substrate 5.

Package

The package 13 as a base substrate illustrated in FIGS. 1A and 1B includes a bottom plate 10, a frame-like substrate 11 provided with bed sections 28a and 28b that are provided on one front surface circumferential edge of the bottom plate 10, a frame-like side wall 12 that is provided on one front surface circumferential edge of the frame-like substrate 11, and a seal ring 40 as a joining material that is provided on the top surface of the side wall 12. The package 13 is provided to accommodate the vibration element 15.

The package 13 as the base substrate has a concave section (inner space 14) of which the top surface is opened. The opening of the concave section is closed by the lid 26 as the cover member that is joined with the side wall 12 through the seal ring 40 as the joining material. The opening of the concave section of the package 13 is closed such that the inner space 14 is formed. The sealed inner space 14 is set to have a desired air pressure of the inner pressure. For example, the inner space 14 is filled with nitrogen gas to have atmospheric pressure, or is in a vacuum (state of a space that is filled with a gas having a lower pressure ($1 \times 10^5$ Pa to $1 \times 10^{-10}$ Pa (JIS Z 8126-1: 1999) than the usual atmospheric pressure), and thus it is possible to continue the more stable vibration of the vibration element 15. In addition, the inner space 14 according to the embodiment is set to be in a vacuum.

The frame-like side wall 12 is provided circumferentially to form substantially a quadrilateral. In other words, the opening that is opened on the top surface of the concave section has a substantially quadrilateral shape. The concave section surrounded by the plate-like bottom plate 10, the frame-like substrate 11, and the side wall 12 forms the inner space (accommodation space) 14 in which the vibration element 15 is accommodated. The seal ring 40 as a joining material, which is provided on the top surface of the side wall 12 is formed of an alloy, such as Kovar. The seal ring 40 functions as the joining material for the lid 26 as the cover member and the side wall 12, and is provided along the top surface of the side wall 12 in a frame shape (circumferential shape of a substantial rectangle).

The package 13 is formed of a material that has the same coefficient of thermal expansion as that of the vibration element 15 or the lid 26, or a very close coefficient of thermal expansion, and in the present example, a ceramic is used. The package 13 is formed by stacking and sintering green sheets molded in a predetermined shape. The green sheet is formed, in a sheet shape, using a kneaded paste produced by dispersing ceramic powder in a predetermined solution and adding a binder to the resultant.

The frame-like substrate 11 that configures the package 13 includes the bed sections 28a and 28b that protrude toward the center from the side wall 12 in a plan view. The bed section 28a and the bed section 28b are provided to diagonally face each other on the package 13. PAD electrodes 22 and 23 are formed on the top surface of the bed section 28a. In addition, a PAD electrode 39 is formed on the top surface of the bed section 28b. The PAD electrodes 22, 23, and 39 are formed by using a conductive paste, such as silver-palladium, or tungstenmetalize, by baking after forming a desired shape, and then by plating the resultant with nickel, gold, or silver. The PAD electrodes 22 and 23 are provided to be connected to the connection electrodes 27 and 29, to be described later, on the vibration element 15, and are electrically connected to an external connection electrode (not illustrated) formed on the outer bottom of the package 13. The PAD electrode 22 is connected to the support section 20. In addition, the PAD electrode 39 is connected to the base 25 for supporting the vibration element 15.

The vibration element 15 is accommodated in the concave section surrounded by the side wall 12 of the package 13, and is attached to the package 13 using a conductive adhesive 21 (joining material) through the support section 20, which includes a plurality of convex sections 18, on a front surface provided on the PAD electrode 22, at a position of the attachment section 8 where the connection electrode 29 on the rear main surface side and the PAD electrode 22 are disposed to overlap each other in a plan view. In addition, the connection electrode 27 on the front main surface side is electrically connected to a PAD electrode 23 using a metal wire (joining wire) 24.

Here, the connection between the support section 20 and the vibration element 15 is described in detail. The support section 20 has a cylindrical shape, and includes a support main body portion 19 that is provided on the bed section 28a side of the frame-like substrate 11 and a plurality of convex sections 18 that protrudes from the top surface of the support main body portion 19. The convex sections 18 according to the present example are disposed in a matrix shape (grid shape) in which the convex sections 18 are provided by forming slits on the top of the cylindrical metal member. Since the support section 20 is formed such that the convex sections 18 protrude from the top surface of the support main body portion 19, the convex sections 18 and the support main body portion 19 can be integrally formed and the support section 20 can be provided in a simple manner. There is no restriction on the number of the convex sections 18. In addition, the convex sections 18 can be formed using a configuration in which a plurality of stud bumps, solder bumps, or the like using a metal, such as gold (Au) is provided. The convex sections 18 are disposed in the grid shape in the above description, but the convex sections 18 may be disposed randomly.

The support section 20 is attached to the PAD electrode 22 on the bed section 28a provided on the frame-like substrate 11 that configures the package 13 using the conductive adhesive 21 such that the lower surface of the support main body portion 19 is fixed to the PAD electrode 22 and the connection electrode 29 of the vibration element 15 is mounted to face the top surfaces of the plurality of convex sections 18. At this time, the conductive adhesive 21 is provided between the top surfaces of the plurality of convex sections 18 and the vibration element 15, in the slit that forms the plurality of convex sections 18, and the periphery of the support main body portion 19.

The conductive adhesive 21 as the joining material is disposed between the top surfaces of the plurality of convex sections 18 and the vibration element 15 and in the slit that forms the plurality of convex sections 18, and thus an attached surface area of the vibration element 15 is increased and it is possible to increase the attachment strength (connection strength). In addition, since the conductive adhesive 21 is disposed in a small space (slit) between the respective convex sections 18 due to the capillarity, the voids are unlikely to be produced, and it is possible to suppress the deterioration of the connection strength due to the voids. The same effect is achieved even using a configuration of the support section 20 in which a plurality of stud bumps or the like is provided. In addition, since the plurality of convex sections 18 is provided in the grid shape, it is possible to support the vibration element 15 to be stable planarly.

The attachment section 8 is disposed between the outer edge 5a of the vibration substrate 5 and outer edges 16a and 17a of the excitation electrodes 16 and 17, in a plan view. The vibration element 15 is disposed such that the support section 20 overlaps the attachment section 8. In addition, the attachment section 8 is formed to be disposed in a region S obtained by rotating a virtual line C that connects a center P of the vibration element 15 with one end of the vibration element 15 (outer edge 5a of the vibration substrate 5) in a range of −35° to +35° of a rotation angle θ about the center P, and an attachment area of the attachment section of the support section 20 with the vibration element 15 becomes 0.7 mm² or more.

Figure 3:
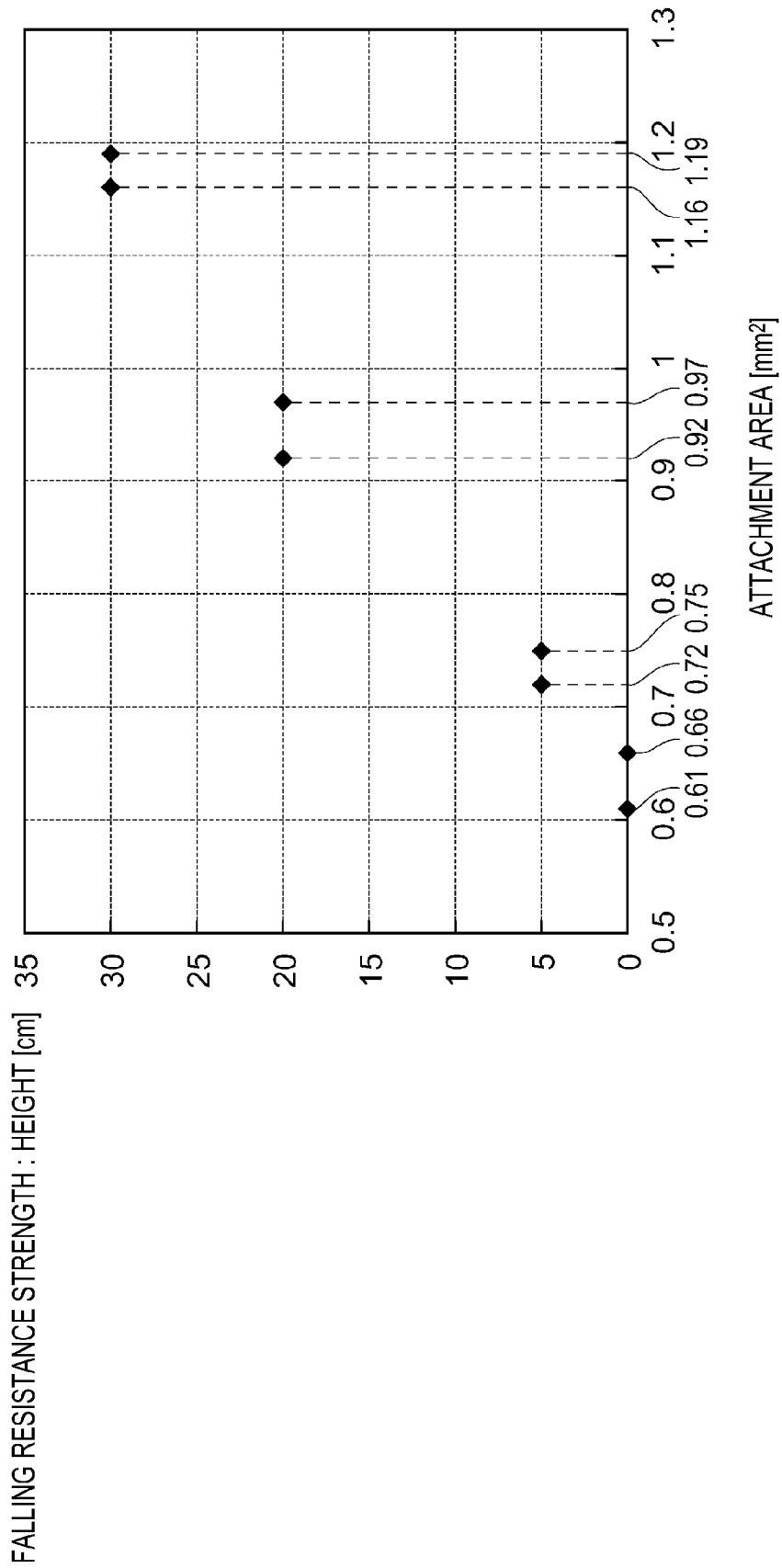
FIG. 3 is a graph illustrating a relation between an area of an attachment section and falling resistance.

Here, a relation between the area of the attachment section 8 and falling resistance is described with reference to FIG. 3. FIG. 3 is a graph illustrating the relation between the area of the attachment section and the falling resistance. FIG. 3 illustrates an example in which a sample uses a vibration element having a resonance frequency of 10 MHz and the vibration element is attached to the support section using the above attachment method, and the falling of the sample is performed from respective heights in six directions (falling with a total of six surfaces of two front surfaces and four side surfaces of a package of the sample to face the falling direction, which is referred to as one cycle (once)) five times per one direction, and the heights at which no damage occurs are plotted. As illustrated in FIG. 3, when the area of the attachment section 8 is 0.61 mm² and 0.66 mm², the attachment is damaged at the falling height of 5 cm. However, when the area of the attachment section 8 is 0.72 mm² and 0.75 mm², there is no damage at the falling height of 5 cm. In addition, when the area of the attachment section 8 is 0.92 mm² and 0.97 mm², there is no damage up to the falling height of 20 cm. Similarly, when the area of the attachment section 8 is 1.16 mm² and 1.19 mm², there is no damage up to the falling height of 30 cm. Accordingly, when the area of the attachment section 8 is 0.72 mm² or greater, it is observed that there is no damage at the falling height of less than 5 cm.

The support section 20 and the vibration element 15 are connected in such a region S with the attachment area, and thus, in addition to the above described effect, while a higher attachment strength (connection strength) is secured using the conductive adhesive 21 as the joining material, it is possible to decrease a dispositional variation of the conductive adhesive 21 and to settle the attachment position in the region S where the characteristics are not affected. As a result, while the attachment strength of the vibration element 15 is further increased, it is possible to provide the resonator 1 in which the degradation of the aging characteristics or the like can be decreased.

Figure 4:
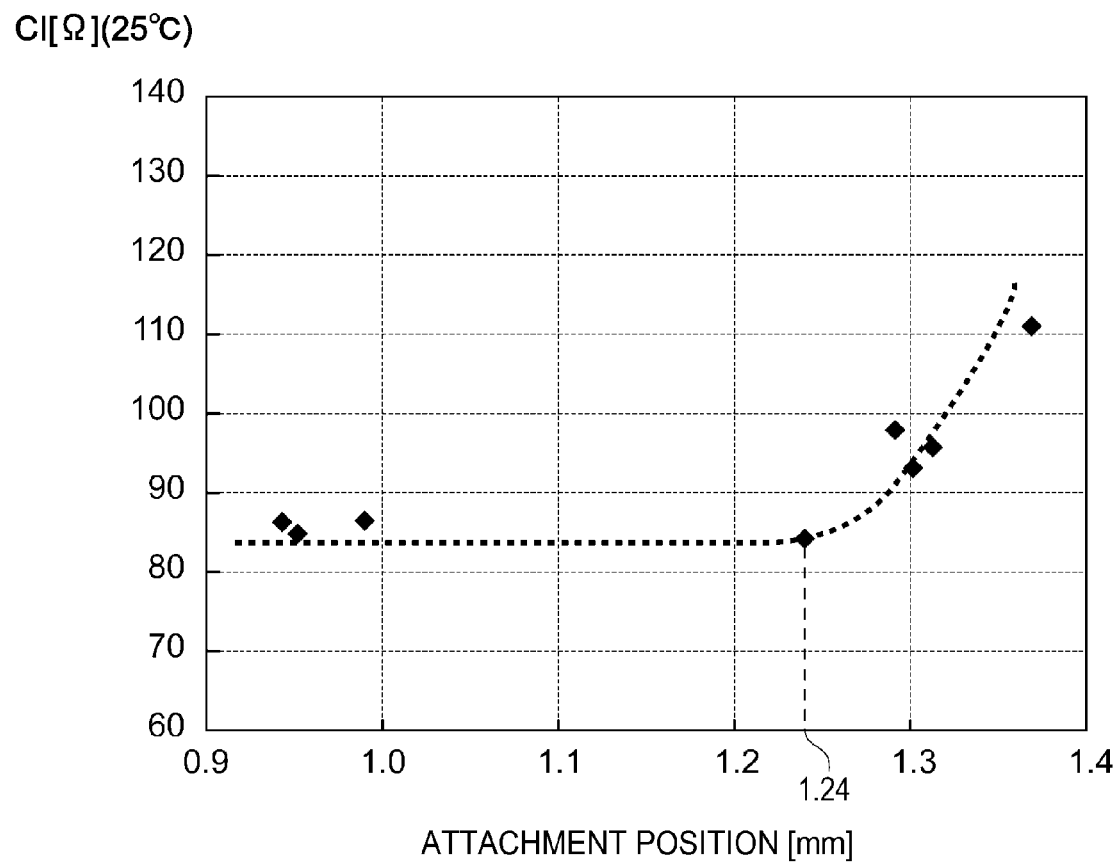
FIG. 4 is a graph illustrating a relation between a position of the attachment section in a vibration element and a CI value.

In addition, it is preferable that the position of the attachment section 8 of the vibration element 15 be disposed within 1.24 mm from one end of the vibration element 15 (outer edge 5a of the vibration substrate 5) toward the center P. An example of this is described with reference to FIG. 4. FIG. 4 is a graph illustrating a relation between the position of the attachment section and the CI value in the vibration element. As illustrated in the graph of FIG. 4, when the position of the attachment section 8 of the vibration element 15 is disposed to exceed 1.24 mm from the outer edge 5a of the vibration substrate 5, the crystal impedance (CI) value that is a characteristic value illustrating the easy occurrence of the vibration of the vibration element 15 is increased, and it is observed that the characteristic degradation starts. Accordingly, it is desirable that the position of the attachment section 8 of the vibration element 15 be disposed within 1.24 mm from the outer edge 5a of the vibration substrate 5.

Figure 5A:
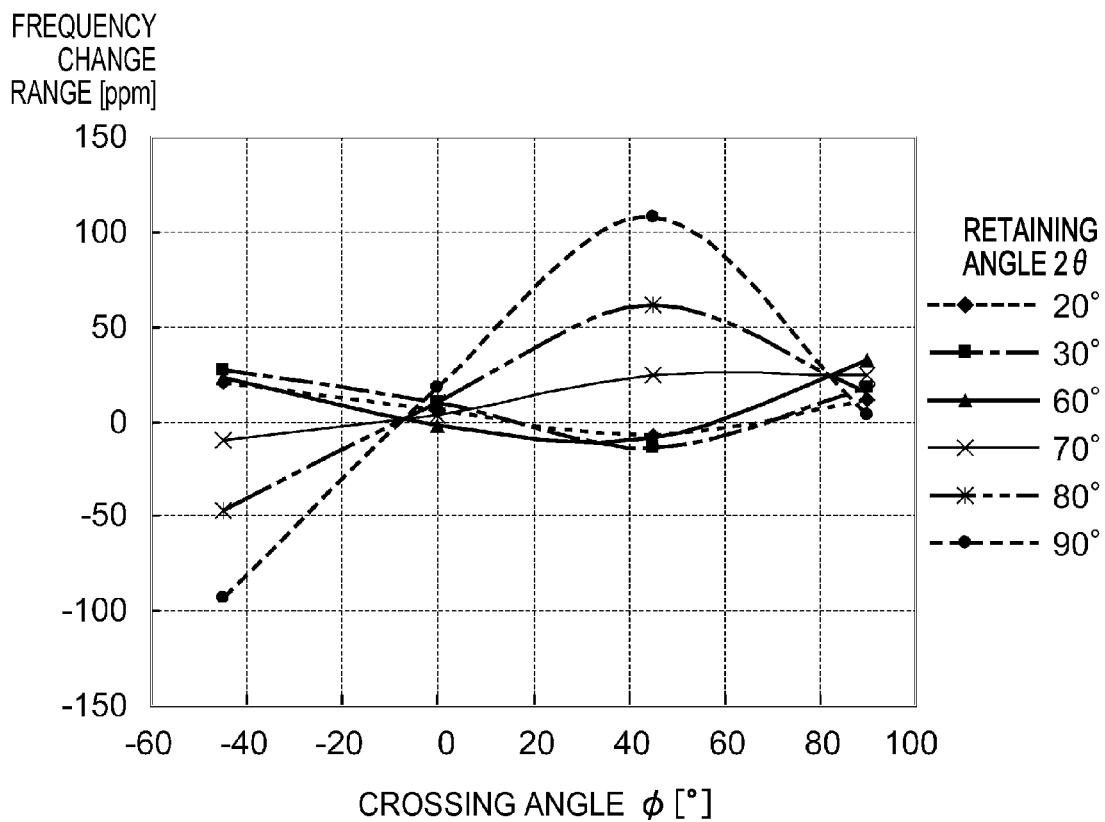
FIGS. 5A and 5B are diagrams illustrating a dispositional region of the attachment section.
Figure 5B:
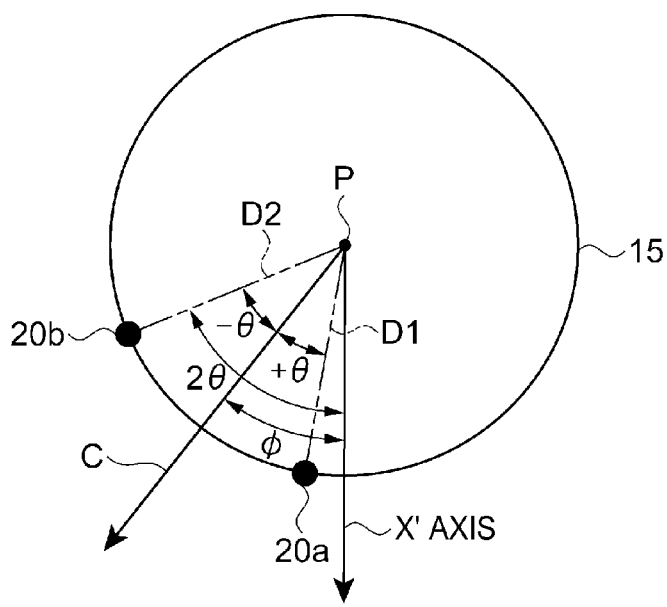

It is further preferable that the attachment section 8 be disposed in the region S interposed between two virtual lines D1 and D2, each of which connects the center P of the vibration element 15 illustrated in FIG. 5B and one end of the vibration element 15 (outer edge 5a of the vibration substrate 5). The region S is formed by rotating the virtual line C by −θ° to +θ° of a rotation angle θ about the center P, with the virtual line C, which connects the one end of the vibration element 15 (outer edge 5a of the vibration substrate 5) to the center P, as a reference line. The attachment section 8 (support section 20) is disposed in the region S, and thus it is possible to further decrease the characteristic degradation of the aging characteristics or the like.

In addition, when the rotation angle θ is in a range of −35° to +35°, in a range of −45° to +90° of a crossing angle φ between the X' axis as the crystal axis of the quartz crystal and the virtual line C as a reference line illustrated in FIG. 5B, a frequency change range can be −25 ppm to +25 ppm, and the frequency change range can be decreased, and thus it is observed that the dependence on the crossing angle φ is not great. FIGS. 5A and 5B are diagrams illustrating a dispositional region of the attachment section. FIG. 5A is a graph illustrating a relation between a retaining angle and the frequency change range, and FIG. 5B is a schematic diagram illustrating the crossing angle φ and the rotation angle θ. The graph of FIG. 5A illustrates a frequency change rate at each crossing angle φ, in a case where the attachment section is provided at the position between the both ends 20a and 20b where the two virtual lines D1 and D2 obtained by rotating the virtual line C by the rotation angle θ, with the virtual line C having the crossing angle φ as the reference line, are crossed with the edges of the vibration element 15, that is, in a case when an angle to be retained is a retaining angle 2θ.

As illustrated in a graph of FIG. 5A, in a case where the rotation angle θ is in a range of −35° to +35°, it is observed that the dependence on the crossing angle φ is not great. In a case where the retaining angle 2θ is 80° (the rotation angle θ is in a range of −40° to +40°), and 90° (the rotation angle θ is in a range of −45° to +45°) in a range of −45° to +90° of the crossing angle φ illustrated in FIG. 5B, the frequency change range exceeds ±25 ppm.

In contrast, when the retaining angle 2θ is 70° or less (the rotation angle θ is in a range of −35° to +35°), it is observed that the frequency change range is ±25 ppm as a usable range in any crossing angle φ. In addition, when the retaining angle 2θ is in a range of 70° or less (the rotation angle θ is in a range of −35° to +35°) in a range of −45° to +90° of the crossing angle φ between the X' axis as the crystal axis of the quartz crystal and the virtual line C, the frequency change range is ±25 ppm as a usable range, and it is observed that the dependence on the crossing angle φ is not great. In addition, when the retaining angle 2θ is in a range of 60° or less (the rotation angle θ is in a range of −30° to +30°), the crossing angle φ is in a range of −10° to +60°, and thus the frequency change range becomes ±10 ppm, and thus it is possible to have a further smaller frequency change range.

The support section 20 in the above description is described as an example in which the support section 20 formed in a single body as a separated member is joined to the package 13. However, the configuration is not limited thereto, and the support section 20 may be configured as part of the bottom plate 10 of the package 13 or as part of the frame-like substrate 11, or may be provided as part of an electrode pattern or the like. In addition, a configuration in which a plurality of the support sections 20 is provided may be employed. In a case of the plurality of support sections 20, it is possible to increase the attachment area. Therefore, the attachment strength of the vibration element 15 can be further improved.

The base 25 is provided on an end, where the connection electrodes 27 and 29 of the vibration element 15 are provided, and the other opposite end side. The base 25 includes a main body section 25a and a convex section 25b that is provided on the main body section 25a. The base 25 is fixed to the PAD electrode 39 on the bed section 28b that is provided on the frame-like substrate 11 that configures the package 13, and has a holding function to support the vibration element 15 on the side opposite to the side where the support section 20 is provided. The base 25 may be provided to overlap at least a part of the vibration element 15 in a plan view. The main body section 25a is connected to the PAD electrode 39 on the bed section 28b, and the convex section 25b, such as stud bumps, metal plating bumps, or soldered bumps using metals, such as gold (Au), is formed on the main body section 25a. The base 25 can be formed by directly arranging the stud bumps, the metal plating bumps, or the soldered bumps that are formed using metals, such as gold (Au), on the PAD electrode 39 on the bed section 28b.

Since such a base 25 is provided, and thus the vibration element 15 is supported by the base 25, it is possible to suppress the displacement of the vibration element 15 on the other end side. Accordingly, it is possible to stabilize the attachment posture (connection posture) of the vibration element 15, and further it is possible to improve the impact resistance. In addition, even when the vibration element 15 is mounted on and attached to the support section 20 using the conductive adhesive 21, it is possible to stabilize the posture of the vibration element 15, that is, to prevent the vibration element 15 from inclining to the other end side, and to perform the attachment of the vibration element 15 in a simple manner.

In the present embodiment, the base 25 is described as an example in which a single base 25 is provided, but a plurality of bases 25 may be provided. There is no restriction on the number of bases 25. When a plurality of bases 25 is provided, it is possible to further stabilize the attachment posture (connection posture) of the vibration element 15.

Lid as the Cover Member

The lid 26 is a plate-like member, closes the opening of the concave section that is opened on the top surface of the package 13, and is joined around the opening of the concave section using, for example, a seam welding method. Since the lid 26 according to the present example has a plate shape, it is easy to form the lid and further it is good to stably form a shape. In addition, a Kovar plate is used for the lid 26 according to the present embodiment. When the Kovar plate is used for the lid 26 and sealing is performed, the seal ring 40 and the lid 26 that are formed of the Kovar are melted in the same molten state, and further it is possible to easily and accurately perform the sealing because the seal ring 40 and the lid 26 are likely to be alloyed. A plate of another material may be used for the lid 26 instead of the Kovar, and for example, a metal material, such as 42 alloy or stainless steel, the same material as that of the side wall 12 of the package 13, or the like can be used for the lid 26.

In the resonator 1 according to the first embodiment described above, the conductive adhesive 21 is disposed between the top surfaces of the plurality of the convex sections 18 and the vibration element 15, that is, in the slit that forms a plurality of convex sections 18, the attachment area of the vibration element 15 is increased, and it is possible to increase the attachment strength. In addition, since the conductive adhesive 21 is disposed in the small space (slit) between the respective convex sections 18 due to the capillarity, the voids are unlikely to be produced, and it is possible to suppress the deterioration of the attachment strength of the vibration element 15 due to the voids. In addition, the position where the attachment section 8 of the vibration element 15 is provided and the attachment area of the vibration element 15 are configured as described above, and thus the dispositional variation of the conductive adhesive 21 is decreased while the attachment strength of the vibration element 15 is secured in the conductive adhesive 21 used in the attachment section 8, and it is possible to decrease the effect of the conductive adhesive 21 on the characteristics of the vibration element 15. Accordingly, while the attachment strength of the vibration element 15 is secured, it is possible to provide the resonator 1 in which it is possible to suppress the degradation of the electrical characteristics, such as the aging characteristics.

Modification Example of Support Section

Figure 6A:
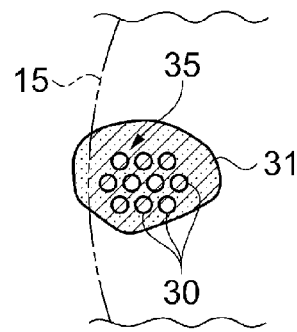
FIGS. 6A to 6D are views illustrating a modification example of a support section.
Figure 6B:
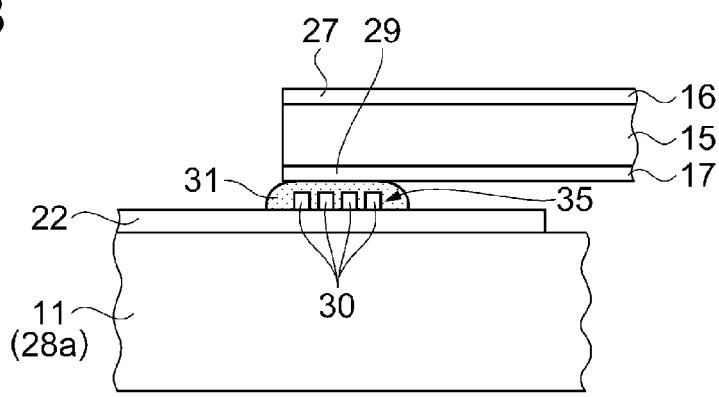
Figure 6C:
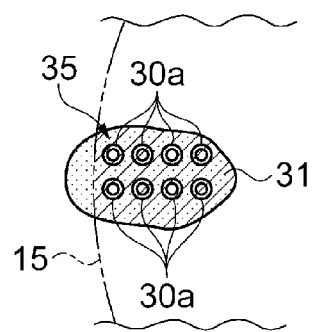
Figure 6D:
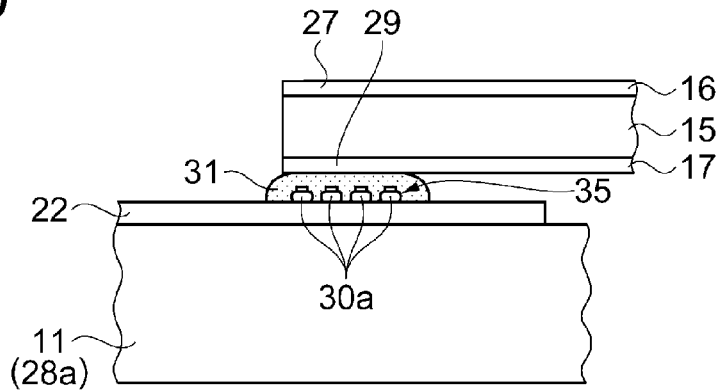

Subsequently, a modification example of the support section will be described with reference to FIGS. 6A to 6D. FIGS. 6A to 6D are views illustrating the modification example of the support section that configures the resonator according to the first embodiment. FIG. 6A is a plan view, FIG. 6B is a front cross-sectional view, FIG. 6C is a plan view of the support section in which bumps are used, and FIG. 6d is a cross-section view of FIG. 6C. The same configuration as that in the first embodiment described above has the same reference signs, and the detailed description thereof is not repeated.

As illustrated in FIGS. 6A and 6B, a support section 35 according to the modification example is configured to have a plurality of protrusions 30 in a grid shape on the PAD electrode 22 provided on the top surface of the frame-like substrate 11 of the package 13. The plurality of protrusions 30 is disposed to have gaps from each other. The plurality of protrusions 30 can be formed using the stud bumps, the metal plating bumps, or the soldered bumps that are formed using metals, such as gold (Au), on the PAD electrode 22 provided on the top surface of the frame-like substrate 11 of the package 13.

Here, as an example of the protrusion 30, a configuration, in which the stud bumps are used, is described with reference to FIGS. 6C and 6D. The stud bumps 30a provided on the PAD electrode 22 are disposed in a grid shape on the PAD electrode 22 provided on the top surface of the frame-like substrate 11 as illustrated in FIG. 6C. In addition, the stud bumps 30a have a configuration in which a cross-sectional shape has at least two widths (diameters) as illustrated in FIG. 6D. In the stud bumps 30a, the width (diameter) on the vibration element 15 side is less than the width (diameter) on the PAD electrode 22 side. Thus, there is a concern that bubbles are produced in the conductive adhesive 31. However, since the width on the vibration element 15 side is small, it is effective to cause the bubbles to be pushed out from the conductive adhesive 31 and not to remain in the conductive adhesive 31. In addition, since the stud bumps 30a are configured to have a round curve, for example a circle in a plan view, as illustrated in FIG. 6C, it is effective to cause the bubbles not to remain in the conductive adhesive 31. In the above description, the stud bumps 30a are provided in a grid shape, but may be provided randomly.

One end of the support section 35 is fixed to the PAD electrode 22 disposed on the top surface of the frame-like substrate 11 of the package 13, and the vibration element 15 is mounted on the top surface that is the other end of the support section 35. The conductive adhesive 31 is disposed in the gaps between the plurality of protrusions 30, between the top surfaces of the protrusions 30 and the connection electrode 29 of the vibration element 15, and on the periphery of the support section 35. The conductive adhesive 31 is solidified, and thus the vibration element 15 is attached and connected to the support section 35.

In the support section 35 according to the modification example, similar to that in the support section 20 according to the first embodiment described above, the conductive adhesive 31 is disposed between the vibration element 15 and the top surfaces of the protrusions 30 as a plurality of convex sections provided in the grid shape, and in the gaps between each of the plurality of the protrusions 30, a connected surface area is increased, and thus it is possible to increase the connection strength. In addition, since the conductive adhesive 31 is disposed into the gaps between the respective protrusions 30 due to the capillarity, the voids are unlikely to be produced, and it is possible to suppress the deterioration of the connection strength due to the voids. In addition, since the plurality of protrusions 30 is provided in the grid shape, it is possible to stably support the vibration element 15 planarly.

Modification Example of Resonator

Figure 7A:
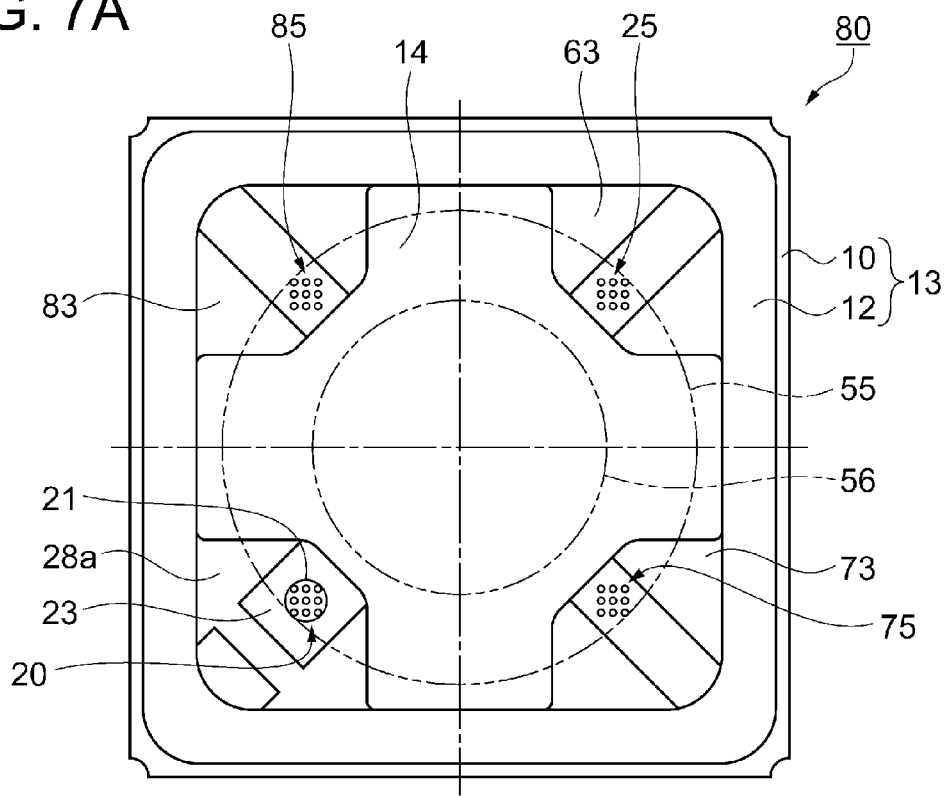
FIGS. 7A and 7B are plan views illustrating modification examples of the resonator.
Figure 7B:
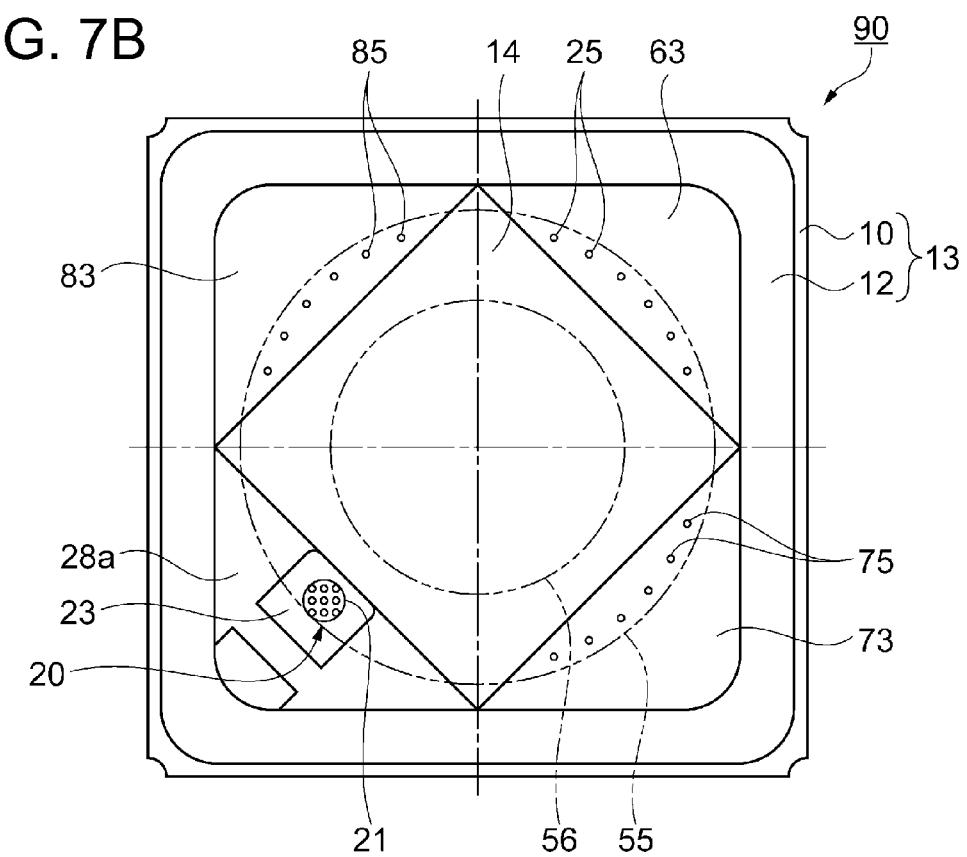

Subsequently, modification examples of the resonator will be described with reference to FIGS. 7A and 7B. FIG. 7A is a plan view illustrating a first modification example of the resonator, and FIG. 7B is a plan view illustrating a second modification example of the resonator. FIGS. 7A and 7B illustrate a state without the lid as the cover member. In addition, according to the first and second modification examples, an example, in which a disc-like SC cut vibration element 55 is used, is described.

Modification Example 1

First, the first modification example of the resonator is described with reference to FIG. 7A. The same configuration as that in the embodiment described above has the same reference signs, and the detailed description thereof is not repeated. A resonator 80 according to the first modification example has a configuration in which a plurality of bases is provided.

The resonator 80 according to the first modification example includes the vibration element 55 that has an excitation electrode 56, the package 13 in which the vibration element 55 is accommodated, the support section 20 that connects the vibration element 55 to the package 13, bases 25, 75, and 85 that hold the vibration element 55, and a lid (not illustrated) as the cover member that forms an inner space (not illustrated) as an accommodation space between the package 13 and the lid. Since the package 13 has the same configuration as described above, the description is not repeated.

The bed section 28a for fixing the vibration element 55 and bed sections 63, 73, and 83 for holding the vibration element 55 are provided on the four corners of the inner space as the accommodation space, respectively, in the substantially rectangular package 13 in a plan view.

The PAD electrode 23 is disposed on the bed section 28a. The support section 20 that includes a plurality of convex sections is disposed on the PAD electrode 23. The support section 20 has the same configuration as the support section 20 described in the first embodiment described above, and in the modification example of the support section. The vibration element 55 is mounted on the support section 20, and is connected and fixed to the support section 20 using the conductive adhesive (not illustrated).

In addition, the bases 25, 75, and 85 are provided on the bed sections 63, 73, and 83, respectively. The bases 25, 75, and 85 are configured to have a plurality of protrusions disposed at positions where the protrusions overlap other ends, in a plan view, which are except one end where the vibration element 55 is attached to the support section 20. The bases 25, 75, and 85 according to the present example are each configured to have nine protrusions, and have a function to hold the vibration element 55.

Modification Example 2

Subsequently, the second modification example of the resonator is described with reference to FIG. 7B. The same configuration as that in the first modification example described above has the same reference signs, and the description thereof is not repeated. A resonator 90 according to the second modification example has a configuration in which the disposition of the protrusions, which configure the base that holds the vibration element 55, is changed.

The resonator 90 according to the second modification example includes the vibration element 55 that has an excitation electrode 56, the package 13 in which the vibration element 55 is accommodated, the support section 20 that connects the vibration element 55 to the package 13, bases 25, 75, and 85 that hold the vibration element 55, and a lid (not illustrated) as the cover member that forms an inner space (not illustrated) as an accommodation space between the package 13 and the lid. Since the package 13 has the same configuration as described above, the description is not repeated.

The bed section 28a for fixing the vibration element 55 and bed sections 63, 73, and 83 for holding the vibration element 55 are provided on the four corners of the inner space in the substantially rectangular package 13 in a plan view.

The PAD electrode 23 is provided on the bed section 28a. The support section 20 that includes a plurality of convex sections is provided on the PAD electrode 23. The support section 20 has the same configuration as the support section 20 described in the first embodiment described above, and in the modification example of the support section. The vibration element 55 is mounted on the support section 20, and is connected and fixed to the support section 20 using the conductive adhesive (not illustrated).

In addition, the bases 25, 75, and 85 are provided on the bed sections 63, 73, and 83, respectively. The bases 25, 75, and 85 are configured to have a plurality of protrusions disposed at positions where the protrusions overlap other ends, in a plan view, which are except one end where the vibration element 55 is attached to the support section 20. The bases 25, 75, and 85 according to the present example are each configured to have six protrusions, provided along the outer circumference of the vibration element 55, and have a function to hold the vibration element 55.

The bases 25, 75, and 85 have different configurations in the resonators 80 and 90 according to the first and second modification examples, but since the vibration element 55 is supported by the bases 25, 75, and 85, similar to the first embodiment, even using each configuration of the bases 25, 75, and 85, it is possible to suppress the displacement of the vibration element 55 on the other side. Accordingly, it is possible to stabilize the connection posture of the vibration element 55, and further it is possible to improve the impact resistance. In addition, even when the vibration element 55 is mounted on and attached to the support section 20 using the conductive adhesive, it is possible to stabilize the posture of the vibration element 55, that is, to prevent the vibration element 55 from inclining to the other end side, and to perform the connection of the vibration element 55 in a simple manner.

In addition, similar to the support section 20 according to the first embodiment described above, the conductive adhesive is disposed between the top surfaces of the plurality of convex sections that configures the support section 20 and the vibration element 55, and in the gaps between each of the plurality of convex sections, the connected surface area is increased, and thus it is possible to increase the connection strength. In addition, since the conductive adhesive is disposed into the gaps between the respective convex sections due to the capillarity, the voids are unlikely to be produced, and it is possible to suppress the deterioration of the connection strength due to the voids.

In the above description, an example is given in which the quartz crystal substrate having a substantially circular external appearance is used as the vibration elements 15 and 55, but the invention can be applied to a quartz crystal substrate of which the external appearance is not substantially circular. For example, the similar effect to that in the above description is achieved even by using a vibration substrate of which the external appearance is substantially a quadrilateral, or a rectangle.

In addition, in the above description, the quartz crystal is used as the piezoelectric material that forms the vibration element 15, but the piezoelectric material is not limited thereto. For example, the piezoelectric material, such as lithium tantalite, lithium niobate, can be used. In addition, silicon or a micro-electromechanical-systems (MEMS) element that forms a vibration element on a glass substrate may be used. In addition, silicon or a vibration element that forms a resonator on a substrate, such as a glass substrate, may be used.

Second Embodiment and Third Embodiment

Figure 8A:
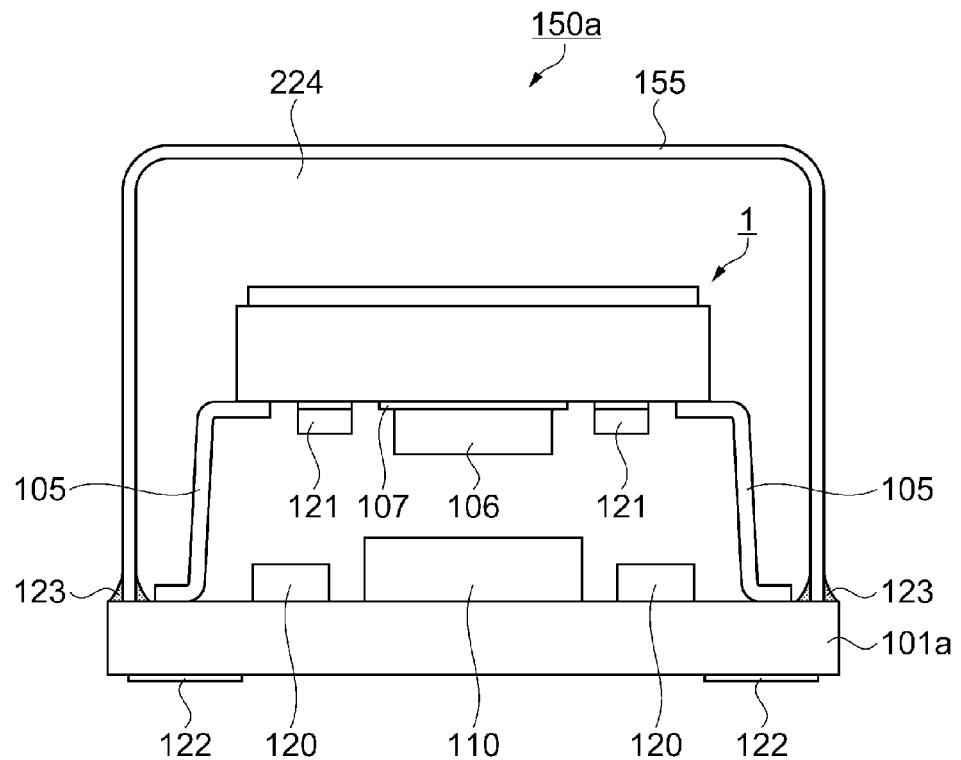
FIGS. 8A and 8B are views schematically illustrating oscillators according to a second embodiment and a third embodiment of the invention.
Figure 8B:
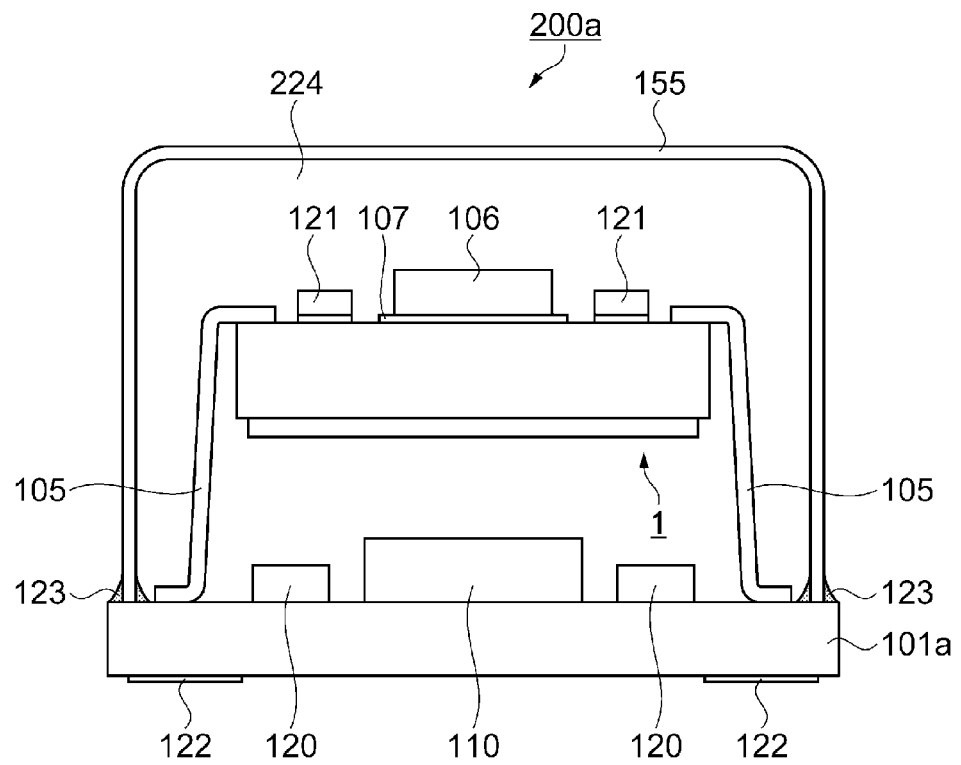

Subsequently, oscillators according to a second embodiment and a third embodiment of the invention are described with reference to FIGS. 8A and 8B. FIGS. 8A and 8B are views schematically illustrating oscillators according to the second embodiment and the third embodiment of the invention, FIG. 8A is a front cross-sectional view illustrating the second embodiment, and FIG. 8B is a front cross-sectional view illustrating the third embodiment. In the following description, the resonator 1 having the same configuration as that in the first embodiment described above has the same reference signs, and the detailed description thereof is not repeated.

First, the oscillator according to the second embodiment illustrated in FIG. 8A is described. An oscillator 150a illustrated in FIG. 8A includes an inner space 224 formed by a metal or resin cap 155 that covers the top of a printed substrate 101a. The cap 155 is connected to the top of the printed substrate 101a using solder 123 or the like. The inner space 224 may not be sealed air-tightly, that is, may be exposed to the atmosphere, or may be an air-tightly sealed space. In the inner space 224, the resonator 1 that is connected to the printed substrate 101a using a connection plate 105, a heating element 106 that is connected to a thermo-conductive layer 107 provided on the rear surface of the resonator 1, and a circuit element 110 that is connected to the top of the printed substrate 101a are provided. The resonator 1 is provided such that the rear surface thereof, to which the heating element 106 is connected, faces the printed substrate 101a, and the resonator 1 is connected to the printed substrate 101a through the connection plate 105. The connection plate 105 has a function to cause an electrical connection between the resonator 1 and the printed substrate 101a. The circuit element 110 has at least a function to control the resonator 1 and the heating element 106. In addition, other circuit components 121, in addition to the heating element 106, may be equipped on the rear surface of the resonator 1. In addition, an electronic component 120, in addition to the circuit element 110, may be equipped on the printed substrate 101a. An external connection terminal 122 is provided on the rear surface (external surface) of the printed substrate 101a. The external connection terminal 122 is electrically connected to the circuit element 110, the electronic component 120, or the like, which is not illustrated.

Subsequently, the oscillator according to the third embodiment illustrated in FIG. 8B is described. An oscillator 200a illustrated in FIG. 8B includes the inner space 224 formed by the metal or resin cap 155 that covers the top of the printed substrate 101a. The cap 155 is connected to the top of the printed substrate 101a using the solder 123 or the like. The inner space 224 may not be sealed air-tightly, that is, may be exposed to the atmosphere, or may be an air-tightly sealed space. In the inner space 224, the resonator 1 that is connected to the printed substrate 101a using the connection plate 105, a heating element 106 that is connected to the thermo-conductive layer 107 provided on the rear surface of the resonator 1, and a circuit element 110 that is connected to the top of the printed substrate 101a are provided. The resonator 1 is disposed such that the rear surface thereof, to which the heating element 106 is connected, faces the top surface (concave surface) of the cap 155, and the resonator 1 is connected to the printed substrate 101a through the connection plate 105. The connection plate 105 has a function to cause an electrical connection between the resonator 1 and the printed substrate 101a. The circuit element 110 has at least a function to control the resonator 1 and the heating element 106. In addition, other circuit components 121, in addition to the heating element 106, may be equipped on the rear surface of the resonator 1. In addition, the electronic component 120, in addition to the circuit element 110, may be equipped on the printed substrate 101a. The external connection terminal 122 is provided on the rear surface (external surface) of the printed substrate 101a. The external connection terminal 122 is electrically connected to the circuit element 110, the electronic component 120, or the like, which is not illustrated.

The oscillators 150a and 200a according to the second embodiment and the third embodiment have the following effects, in addition to the effects of the resonator 1 according to the first embodiment. It is possible to transmit heat energy of the package 13 (see FIGS. 1A and 1B) heated by the heating element 106 to the vibration element 15 (see FIGS. 1A and 1B). In addition, the thermo-conductive layer 107 is provided on the rear surface of the package 13 (see FIGS. 1A and 1B) of the resonator 1. Since the external shape (outer edge) of the thermo-conductive layer 107 is provided to include the external shape (outer edge) of the heating element 106, it is possible to disperse the heat energy generated by the heating element 106 to a wide area by the thermo-conductive layer 107, and to heat the package 13 using the wide area. Accordingly, it is possible to warm (heat) the package 13 at a uniform temperature. Accordingly, the vibration element 15 can be maintained in a predetermined constant temperature state, and it is possible to provide the oscillators 150a and 200a using the resonator 1 in which it is possible to suppress the frequency fluctuation depending on the temperature change in the operating environment and the accuracy of the so-called frequency-temperature characteristics is increased. That is, it is possible to provide the oscillators 150a and 200a in which the characteristic variation is suppressed due to the temperature change of the operating environment.

According to the second and third embodiments, the oscillators 150a and 200a are described as examples, but the invention can be applied to a so-called temperature compensation type resonator in which the circuit element 110 is not mounted.

Electronic Apparatus

Subsequently, an electronic apparatus, to which the resonator 1, or the oscillator 150a or 200a according to one embodiment of the invention is applied, will be described in detail with reference to FIGS. 9 to 11. In the description, an example, in which the resonator 1 that includes the vibration element 15 is applied, is represented.

Figure 9:
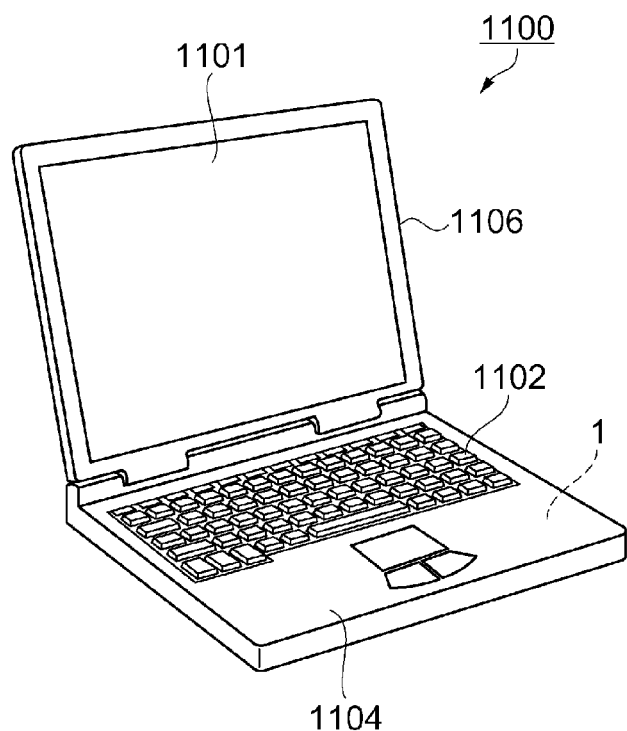
FIG. 9 is a perspective view illustrating a configuration of a mobile-type personal computer as an example of an electronic apparatus.

FIG. 9 is a perspective view illustrating a schematic configuration of a mobile-type (or notebook-type) personal computer as an electronic apparatus that includes the resonator 1 according to one embodiment of the invention. In FIG. 9, a personal computer 1100 is configured to have a main body section 1104 that includes a keyboard 1102, and a display unit 1106 that includes a display section 1101, and the display unit 1106 is rotatably supported with respect to the main body section 1104 through a hinge structure section. The resonator 1 that has a function as a timing source of a signal process is equipped in the personal computer 1100.

Figure 10:
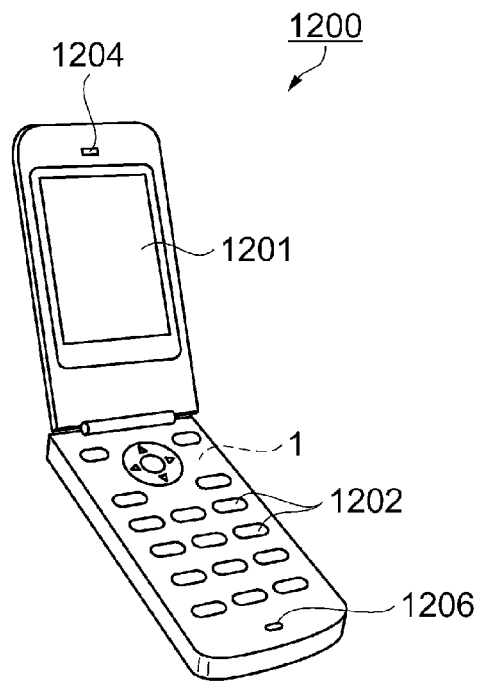
FIG. 10 is a perspective view illustrating a configuration of a mobile phone as an example of the electronic apparatus.

FIG. 10 is a perspective view illustrating a schematic configuration of a mobile phone (including a PHS) as the electronic apparatus that includes the resonator 1 according to one embodiment of the invention. In FIG. 10, a mobile phone 1200 includes a plurality of operation buttons 1202, an earpiece 1204, and a mouthpiece 1206. A display section 1201 is disposed between the operation buttons 1202 and the earpiece 1204. Such mobile phone 1200 is equipped with the resonator 1 that has a function as the timing source of the signal process.

Figure 11:
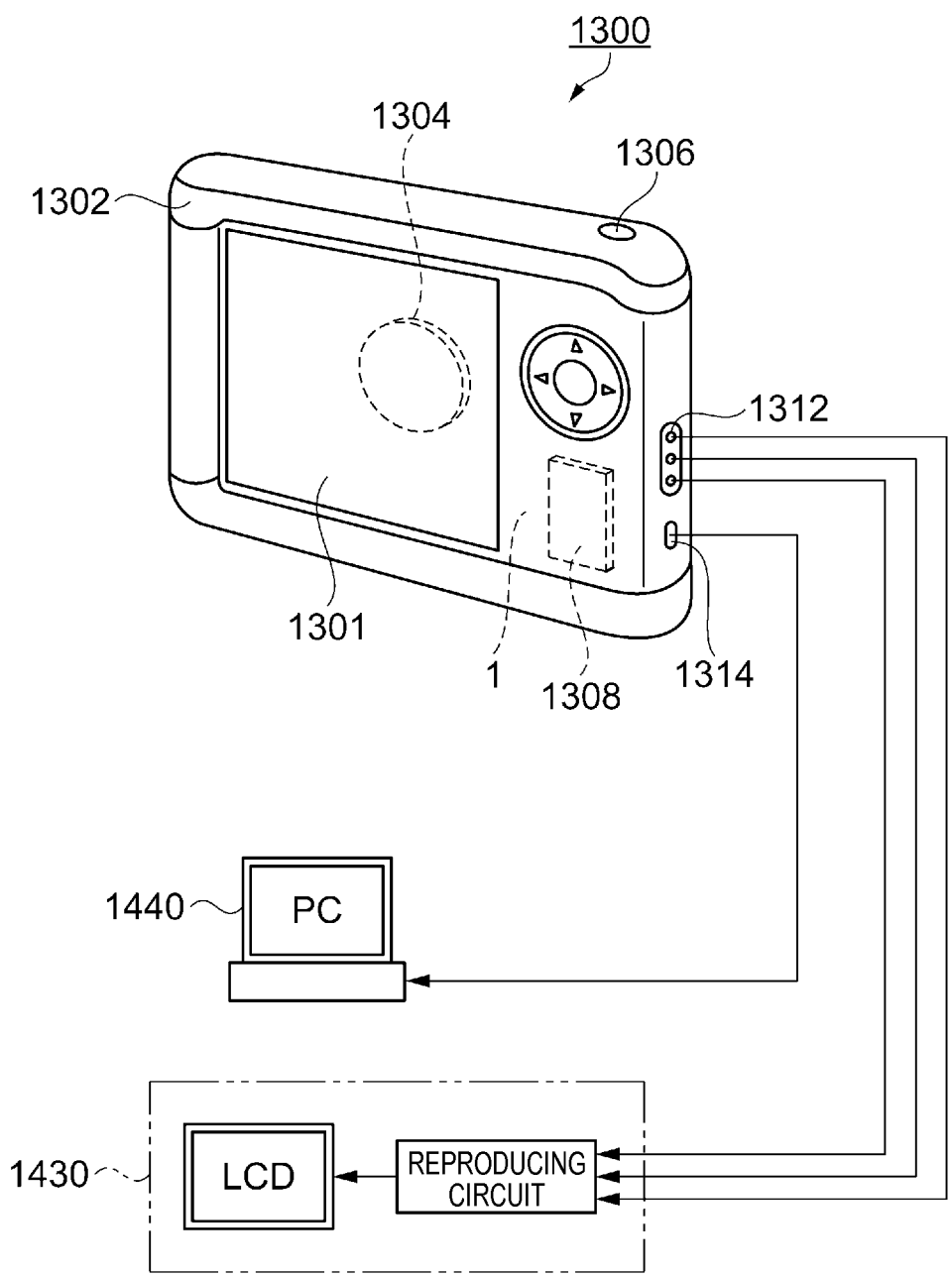
FIG. 11 is a perspective view illustrating a configuration of a digital still camera as an example of the electronic apparatus.

FIG. 11 is a perspective view illustrating a schematic configuration of a digital still camera as an electronic apparatus that includes the resonator 1 according to one embodiment of the invention. In FIG. 11, a connection to an external apparatus is illustrated in a simplified manner. Here, a film camera in the related art causes an analog photography film to be photosensitive to an optical image of a subject. In contrast, a digital still camera 1300 performs photoelectric conversion of an optical image of a subject, using an imaging device, such as a charge coupled device (CCD), and generates an imaging signal (image signal).

A display section 1301 is provided on the back surface of a case (body) 1302 in the digital still camera 1300, and has configuration in which a display is performed on the basis of an imaging signal by the CCD, and the display section 1301 functions as a finder to display the subject as an electronic image. In addition, a photosensitive unit 1304 that includes an optical lens (imaging optical system), a CCD, or the like is provided on the front surface side (rear surface side in FIG. 11) of the case 1302.

When a photographer checks an image of a subject displayed on the display section 1301, and presses a shutter button 1306, an imaging signal of the CCD at the time point is transmitted to and stored in a memory 1308. In addition, in the digital still camera 1300, a video signal output terminal 1312 and an input/output terminal 1314 for data communication are provided on the side surface of the case 1302. As illustrated in FIG. 11, a television monitor 1430 is connected to the video signal output terminal 1312, and a personal computer 1440 is connected to the input/output terminal 1314 for data communication, as necessary. Further, the imaging signal stored in the memory 1308 is configured to be output to the television monitor 1430 or to the personal computer 1440 by a predetermined operation. The resonator 1 that has a function as a timing source of a signal process is equipped in such a digital still camera 1300.

In addition to applications of the resonator 1 according to one embodiment of the invention to the personal computer (mobile personal computer) in FIG. 9, to the mobile phone in FIG. 10, and to the digital still camera in FIG. 11, the resonator 1 according to one embodiment of the invention can be applied to an electronic apparatus, such as an ink jet discharge apparatus (for example, ink jet printer), a laptop personal computer, a TV, a video camera, a video tape recorder, a car navigation device, a pager, an electronic organizer (including a communication function), an electronic dictionary, a calculator, an electronic game device, a word processor, a workstation, a TV phone, a security television monitor, electronic binoculars, a POS terminal, a medical apparatus (for example, an electronic thermometer, a sphygmomanometer, a blood glucose meter, an electrocardiogram measuring device, an ultrasonic diagnostic apparatus, or an electronic endoscope), a fishfinder, various measurement apparatuses, meters (for example, meters on a vehicle, an aircraft, or a ship), or a flight simulator. When the oscillator 150a or 200a that includes the heating element 106 described in the above second and third embodiments is used, the oscillator is preferably applied to an electronic apparatus used under harsh climate conditions of a communication base station or the like.

Moving Object

Figure 12:
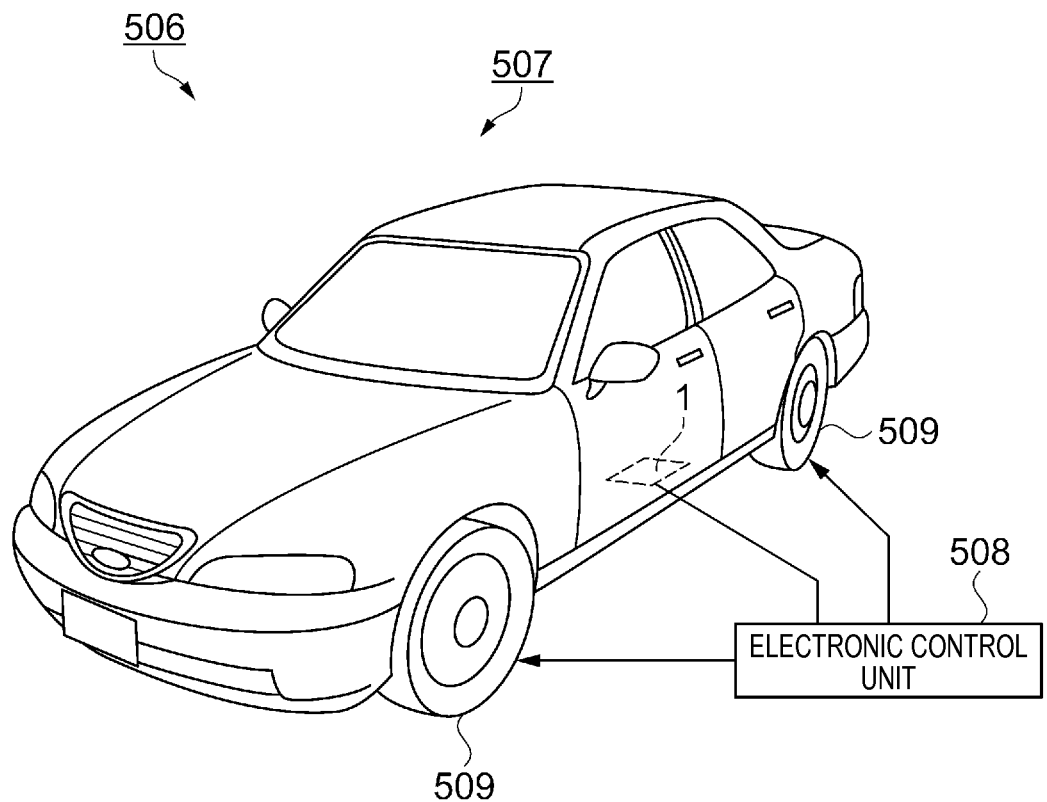
FIG. 12 is a perspective view illustrating an automobile as an example of a moving object.

FIG. 12 is a perspective view schematically illustrating an automobile as an example of a moving object. The resonator 1 according to the invention is mounted on an automobile 506. For example, as illustrated in FIG. 12, an electronic control unit 508 in which the resonator 1 is equipped and which controls a tire 509 or the like is mounted on a vehicle body 507 in the automobile 506 as the moving object. In addition, the resonator 1 can be widely applied to an electronic control unit (ECU), such as keyless entry, an immobilizer, a car navigation system, a car air conditioner, an anti-lock brake system (ABS), an airbag, a tire pressure monitoring system (TPMS), an engine control, a battery monitor of a hybrid car or an electric car, or a vehicle body posture control system.

The entire disclosure of Japanese Patent Application No. 2013-229054, filed Nov. 5, 2013 is expressly incorporated by reference herein.

What is claimed is:
1. A resonator comprising:
a base substrate;
a support section that is provided on a surface of the base substrate;

a vibration element which includes a vibration substrate, excitation electrodes provided on main surfaces thereof, and an attachment section disposed on one of the main surfaces between an outer edge of the vibration substrate and an outer edge of the excitation electrode; and a joining wire connected to another main surface of the vibration element at a position overlapping the attachment section in a plan view, wherein the attachment section is attached to the support section through a conductive adhesion, the joining wire connects the vibration element and the base substrate, and the attachment section is disposed in a region obtained by rotating a virtual line which connects the center of the vibration element and one end of the vibration element in a range of −35° to +35° of a rotation angle θ about the center, and an attachment area becomes 0.7 mm² or more.

2. The resonator according to claim 1, wherein the rotation angle θ is −30° to +30°.

3. The resonator according to claim 1, wherein the vibration substrate is an SC cut quartz crystal substrate that has an orthogonal coordinate system (X', Y'', Z') which is obtained by rotating an orthogonal coordinate system (X, Y, Z) about an X axis by a predetermined angle, and rotating a new orthogonal coordinate system (X, Y', Z') obtained by the previous rotation about a Z' axis by a predetermined angle, and wherein a crossing angle φ formed by the X' axis and the virtual line is in a range of −45° to +90°.

4. The resonator according to claim 2, wherein the vibration substrate is an SC cut quartz crystal substrate that has an orthogonal coordinate system (X', Y'', Z') which is obtained by rotating an orthogonal coordinate system (X, Y, Z) about an X axis by a predetermined angle, and rotating a new orthogonal coordinate system (X, Y', Z') obtained by the previous rotation about a Z' axis by a predetermined angle, and wherein a crossing angle φ formed by the X' axis and the virtual line is in a range of −45° to +90°.

5. The resonator according to claim 3, wherein the crossing angle φ is in a range of −30° to +30°.

6. The resonator according to claim 4, wherein the crossing angle φ is in a range of −30° to +30°.

7. The resonator according to claim 1, wherein a plurality of the attachment sections is provided.

8. The resonator according to claim 2, wherein a plurality of the attachment sections is provided.

9. The resonator according to claim 1, wherein a plurality of convex sections is provided on a front surface of the support section.

10. The resonator according to claim 2, wherein a plurality of convex sections is provided on a front surface of the support section.

11. The resonator according to claim 1, wherein the support section includes:
a support main body section that is provided on the base substrate; and
a plurality of convex sections that protrude from the top surface of the support main body section.

12. The resonator according to claim 2, wherein the support section includes:
a support main body section that is provided on the base substrate; and
a plurality of convex sections that protrude from the top surface of the support main body section.

13. The resonator according to claim 1, wherein the support section is configured to have a plurality of convex sections that are provided separately from the base substrate.

14. The resonator according to claim 2, wherein the support section is configured to have a plurality of convex sections that are provided separately from the base substrate.

15. The resonator according to claim 13, wherein each of the plurality of convex sections is a metal bump.

16. The resonator according to claim 1, wherein a base is provided on a surface of the base substrate facing the end of the vibration element in a region except for a portion where the attachment section is disposed.

17. The resonator according to claim 16, wherein a plurality of the bases is provided.

18. An oscillator comprising:
the resonator according to claim 1;
a circuit element that is electrically connected to the resonator; and
a package on which the resonator and the circuit element are mounted.

19. An electronic apparatus comprising:
the resonator according to claim 1.

20. A moving object comprising:
the resonator according to claim 1.

* * * * *